(12) United States Patent
Damadian

(10) Patent No.: US 6,973,711 B1
(45) Date of Patent: Dec. 13, 2005

(54) METHOD FOR MAKING PIECES FOR A MAGNETIC RESONANCE IMAGING MAGNET

(75) Inventor: Raymond V. Damadian, Woodbury, NY (US)

(73) Assignee: Fonar Corporation, Melville, NY (US)

( * ) Notice: Subject to any disclaimer, the term of this patent is extended or adjusted under 35 U.S.C. 154(b) by 0 days.

(21) Appl. No.: 09/577,476

(22) Filed: May 24, 2000

(51) Int. Cl.⁷ ................................................ H01F 7/06
(52) U.S. Cl. ................. 29/602.1; 29/604; 29/607; 29/417; 83/13; 365/171
(58) Field of Search .............................. 29/737, 602.1, 29/607, DIG. 105, DIG. 95, 744, 852, 53, 29/412, 417, 604, 609; 83/177, 13, 26; 264/157, 264/158, 138; 156/293, 294; 335/250, 291, 335/216; 365/171, 173, 213, 158; 451/39, 451/38; 507/240

(56) References Cited

U.S. PATENT DOCUMENTS

| | | | |
|---|---|---|---|
| 2,901,430 A * | 8/1959 | Chiddix et al. | ......... 507/240 X |
| 3,026,652 A * | 3/1962 | Helmerson et al. | ..... 264/158 X |
| 3,813,767 A * | 6/1974 | Sasaki et al. | ................. 29/604 |
| 3,849,878 A * | 11/1974 | Rudd | ........................... 29/610 |
| 4,736,513 A * | 4/1988 | Barbier | ......................... 29/605 |
| 5,061,897 A | 10/1991 | Danby et al. | |
| 5,062,305 A * | 11/1991 | Hansen | ..................... 73/861.12 |
| 5,124,651 A | 6/1992 | Danby et al. | |
| 5,252,924 A | 10/1993 | Sakurai et al. | |
| 5,283,544 A | 2/1994 | Sakurai et al. | |
| 5,345,208 A * | 9/1994 | Dorri | ......................... 335/301 |
| 5,446,434 A * | 8/1995 | Dorri | ......................... 335/298 |
| 5,495,171 A | 2/1996 | Danby et al. | |
| 5,550,472 A * | 8/1996 | Richard | ...................... 324/320 |
| 5,555,251 A | 9/1996 | Kinanen | |
| 5,583,439 A | 12/1996 | Danby et al. | |
| 5,592,089 A | 1/1997 | Danby et al. | |
| 6,150,819 A * | 11/2000 | Laskaris | ..................... 324/319 |
| 6,255,928 B1 * | 7/2001 | van Oort | .................... 335/216 |

FOREIGN PATENT DOCUMENTS

JP 3-69310 * 3/1991 ................. 264/138

OTHER PUBLICATIONS

Waterjet Systems, Flow International Corp. copyright 1996.

* cited by examiner

Primary Examiner—A. Dexter Tugbang
(74) Attorney, Agent, or Firm—Lerner, David, Littenberg, Krumholz & Mentlik, LLP

(57) ABSTRACT

A method for producing a shim piece for a magnetic resonance imaging (MRI) magnet. The shim piece is used to form a shim of a magnet and is designed to suppress eddy currents in the shim created by the introduction of a gradient magnetic field. The shim piece is formed by a plurality of ferromagnetic rods placed side-by-side and surrounded by a dielectric material.

30 Claims, 5 Drawing Sheets

METHOD FOR MAKING PIECES FOR A MAGNETIC RESONANCE IMAGING MAGNET

FIELD OF THE INVENTION

The present invention relates to a method and apparatus for suppressing eddy currents and in particular, a shim bar and a method of manufacture thereof for the suppression of eddy currents in magnetic resonance imaging magnet assemblies or systems.

BACKGROUND OF THE INVENTION

The magnet assemblies used in Magnetic Resonance Imaging ("MRI") must create a very strong static primary magnetic field with precise geometry. A dynamic gradient magnetic field is then added over the primary magnetic field. Particular imaging sequences used to create MRI images require application of the gradient field with rapid variations in amplitude.

Certain static-field magnets use ferromagnetic poles projecting toward a patient receiving space. The flux in the patient receiving space is fairly uniform near the central axis of the pole. However, at the edges of the poles, remote from the central axis, the field tends to bulge outward away from the central axis, thereby altering the flux geometry.

The problem of the bulging of the magnetic field at the edges of the magnet has been addressed by adding shims to adjust the shape of the magnetic field flux. A shim is a piece of metal, typically a low carbon steel or other ferromagnetic material, that projects from the poles, typically near the edges of the poles. For example, a shim on a cylindrical pole may be partially in the form of a circular rim projecting toward the patient. This added magnetic material changes the shape of the poles, and therefore the shape of the field the magnet creates. The result is a change in magnetic flux profile at the edges and a more uniform magnetic field.

The gradient fields commonly are added by gradient coils disposed adjacent to the pole surfaces. Eddy currents can be induced in the ferromagnetic poles as the current in the gradient coils is varied. The eddy currents, in turn, induce their own magnetic fields. This effect is undesirable because it lengthens the time it takes for the gradient flux to stabilize at the desired amplitude, and creates undesirable variations in the magnetic field which cause a loss of image quality.

One structure to suppress eddy currents in magnetic assemblies is disclosed in U.S. Pat. No. 5,124,651 to Danby, et al. ("'651 patent"), the disclosure of which is incorporated by reference herein. The preferred embodiments of the '651 patent provide pole faces resistant to eddy currents. Each pole face includes a plurality of narrow, ferromagnetic solid rods positioned side-by-side to each other. These rods are bonded to one another by an epoxy resin or other non-conductive bonding material, thereby creating thin cylinders. The thin cylinders are mounted on the tips of the poles so that the axes of the cylinders, and the axes of the individual rods, extend generally parallel to the polar axis of the magnet. The rods are electrically insulated from one another by the non-conducting bonding material. This eliminates eddy currents directions transverse to the polar axis to the magnetic flux while providing enough ferromagnetic material to facilitate magnetic field flux in directions parallel to the polar axis. In certain embodiments according to the '651 patent, a shim ring can be formed by rods at the edges of the cylinder extending beyond the remainder of the cylinder.

While this structure is effective in suppressing eddy currents in magnetic assemblies, there are still needs for further improvements.

SUMMARY OF THE INVENTION

The present invention provides a shim bar and a method of manufacture addressing those needs.

One aspect of the present invention provides a method for manufacturing a shim bar that suppresses eddy currents. The method according to this aspect preferably includes the steps of providing a mold where a plurality of ferromagnetic rods are placed in a side-by-side direction. A dielectric is introduced between the rods to form a shim piece with the thickness direction corresponding to the lengthwise direction of the ferromagnetic rods. These shim pieces can be arranged to form a shim ring around a pole of a magnet. The shim ring can be substantially closed or with spaces or gaps between the shim pieces. The mold can be shaped to provide a generally arcuate shim piece. Also, the shim pieces can be trimmed to form an arcuate shim piece. The mold can also desirably be shaped as to have a depth corresponding to the thickness of the shim piece.

Another aspect of the invention also provides a method for manufacturing a shim bar that suppresses eddy currents. The method according to this aspect of the invention preferably includes the steps of providing an intermediate element consisting of a plurality of elongated ferromagnetic rods extending side-by-side in a lengthwise direction with a dielectric material such as an epoxy or other binding material therebetween; and slicing the intermediate element transverse to the lengthwise direction, thereby forming a plurality of shim pieces each with a thickness direction corresponding to the lengthwise direction of the rods of the intermediate element. A plurality of shim pieces can be assembled with a magnet pole to form a shim on that pole. The shim formed by the assembly desirably is in the shape of a substantially closed shim ring.

Preferably, the shim pieces are all of substantially equal thickness. The slicing step may be performed by slicing the intermediate element using a cut-off saw. The method may further include the step of trimming the resulting shim pieces to alter their profile after the shim pieces are sliced from the intermediate element. Desirably, this step is performed to give each shim piece a generally arcuate shape in a plane transverse to the thickness direction of the shim pieces. The trimming step is performed at least in part by using an abrasive jet, milling machine or both. In methods according to other embodiments, an intermediate element has a generally arcuate shape in section transverse to the longitudinal direction of the rods, such that the shim pieces formed by slicing are also generally arcuate. The shim pieces may further be trued-up to form precisely flat surfaces extending transverse to the axes of the rods, as for example by using a milling machine.

Most preferably, the rods are cleaned of any oily residue before they are bonded together to form the intermediate element. Further, the surfaces of the rods may be sandblasted or otherwise roughened to promote adhesion of the bonding material and to remove any organic or inorganic contaminants. It is also preferred to cover each rod, before application of the bonding material to form the intermediate element, with a sleeve of a dielectric porous material such as a mesh formed from fibrous glass or other fibrous dielectric material. This porous material holds the rods apart from one another during bonding and thereby assures that the rods will be electrically insulated from one another. The step of applying the bonding material desirably includes placing the rods in a mold and pouring in a dielectric material around the rods. The dielectric bonding material desirably penetrates the porous sleeves and contacts the roughened rod surface. The rods desirably have hexagonal cross-sections.

A further aspect of the present invention provides a shim piece for use in forming a shim on a magnet. The shim piece comprises a plurality of ferromagnetic elements with a dielectric therebetween with the shim piece having a thickness direction and a generally arcuate shape in a plane transverse to the thickness direction such that each shim piece has two ends spaced apart from one another. The ferromagnetic elements desirably include ferromagnetic rod sections having axes with, the rods being disposed substantially side-by-side with the axes extending in the thickness direction of the shim piece.

In another aspect of the present invention, a magnet is provided which includes a ferromagnetic structure defining a first pole having a pole axis, a plurality of shim pieces, as discussed above, with at least some shim pieces being attached to the first pole with the thickness directions of the shim pieces on the first pole being generally co-directional with the pole axis. The shim pieces attached to said first pole are arranged generally end-to-end so that the shim pieces define a first shim ring extending around the pole axis. Typically, the ferromagnetic structure also defines a second pole spaced apart from the first pole on the pole axis, and the shim pieces include shim pieces attached to the second pole. The thickness directions of the shim pieces attached to the second pole are also co-directional with the pole axis, and the shim pieces attached to the second pole are also arranged generally end-to-end so that those shim pieces define a second shim ring extending around the pole axis. In this structure, the magnet typically has first and second shim rings of equal diameter and both concentric with the pole axis. As further discussed below, the magnet may be equipped with gradient coils, and the windings of the gradient coils may be in proximity to the shim rings. In such a structure, the gradient coil windings may be positioned close to the shim rings. The eddy current suppression provided by the shim rings is particularly significant in this configuration.

DETAILED DESCRIPTION OF THE PREFERRED EMBODIMENT

Figure 1A:
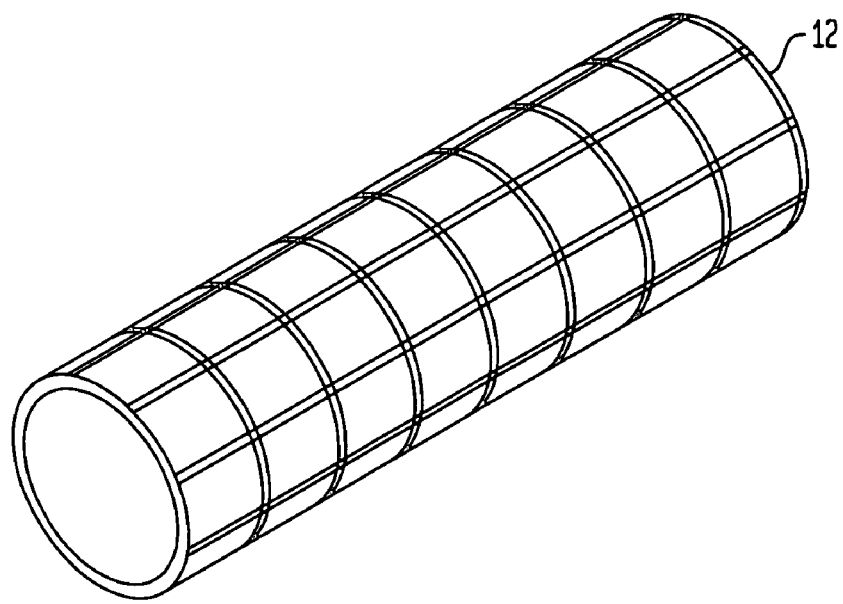
FIG. 1a is a diagrammatic perspective view of a porous sleeve used in a method according to one embodiment of the invention.
Figure 1B:
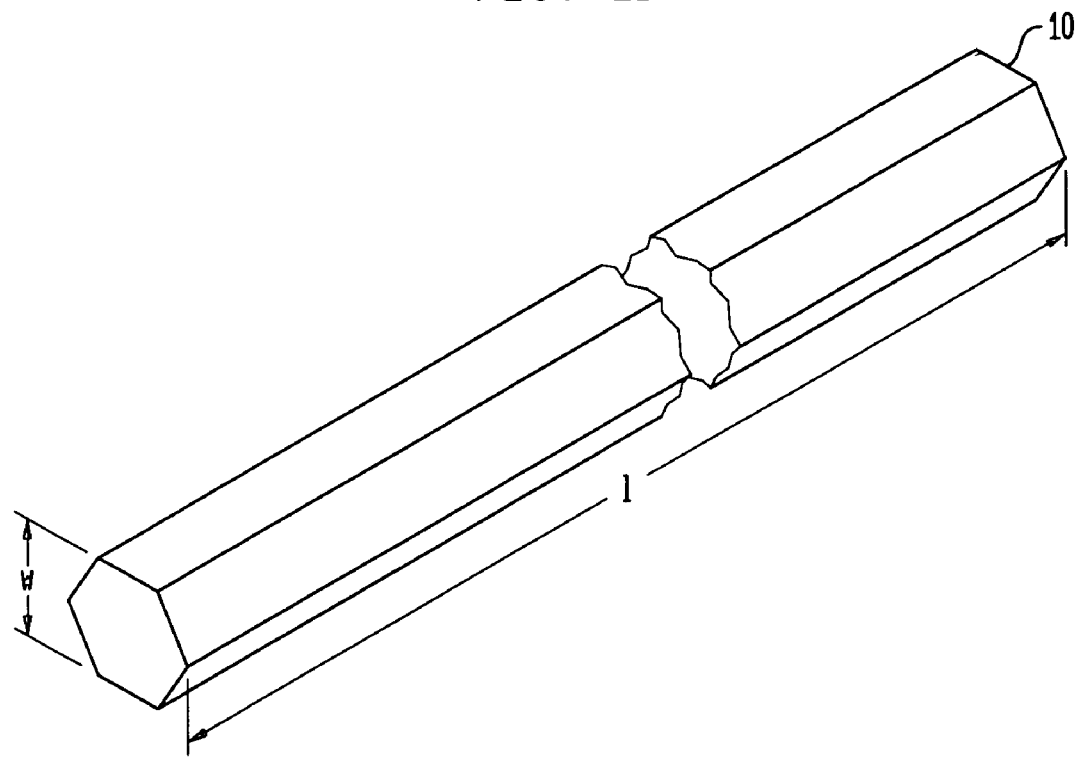
FIG. 1b is a diagrammatic perspective view of a rod used in a method according to one embodiment of this invention

Referring to FIG. 1, a ferromagnetic rod 10 of hexagonal cross-section is shown having a width dimension w and length l. The ferromagnetic rod 10 is preferably composed of a low carbon steel having high magnetic permeability such as Grade 1001 steel, but can be made from other suitable metals. When the final shim is formed, there is enough magnetic material to alter the shape of the field, consistent with the function of a shim bar as disclosed in the prior art. By way of example, the ferromagnetic rod 10 preferably has a width w of about 12.7 mm. Increasing the width of the ferromagnetic rod 10 will increase the amount of ferromagnetic material in the final shim. This may allow eddy currents to travel along the width w direction. Decreasing the width of the ferromagnetic rod 10 may complicate the assembly of the final shim piece and decrease the individual structural integrity of the rod. Also by way of example, the length l of the ferromagnetic rod 10 is preferably 732.9 mm. This length dimension l may be altered depending on the particular assembly arrangement. Further, the axis of the rod 10 runs along the length l direction.

The ferromagnetic rod 10 is preferably cleaned of any oily residue. This can be accomplished by any acceptable method and preferably by using a lint-free solvent wiping rag which preferably contains a high vapor pressure solvent such as acetone. An oil-free rod 10 promotes the adhesion of the bonding material around the rods. Further, it is preferred that the surface of the ferromagnetic rod 10 is roughened as this increases the surface area of the rod and also promotes bonding. The roughening of the rod 10 is preferably accomplished by using a sand-blaster with 80 mesh Brown aluminum oxide material. Finally, to promote bonding, removal of any organic or inorganic compound such as dirt or oxides is required. The blasting step not only roughens the rod but also removes these contaminants.

As shown in FIG. 1, a tubular sleeve 12 is also provided. This sleeve 12 is composed of a dielectric material and is generally porous. Preferably, the porous dielectric is a mesh formed from a fibrous glass material, such as 0.006 thick Litewall-brand insulation, untreated without impregnated epoxy fiberglass sleeving. One ferromagnetic rod 10 is placed within each sleeve 12 thus covering the entire rod in the length l direction. Each sleeve 12 may be provided as a tube which is slid lengthwise over the rod. Alternatively, the sleeves may be formed in place on the rods by winding a porous fabric tape onto each rod.

Figure 2A:
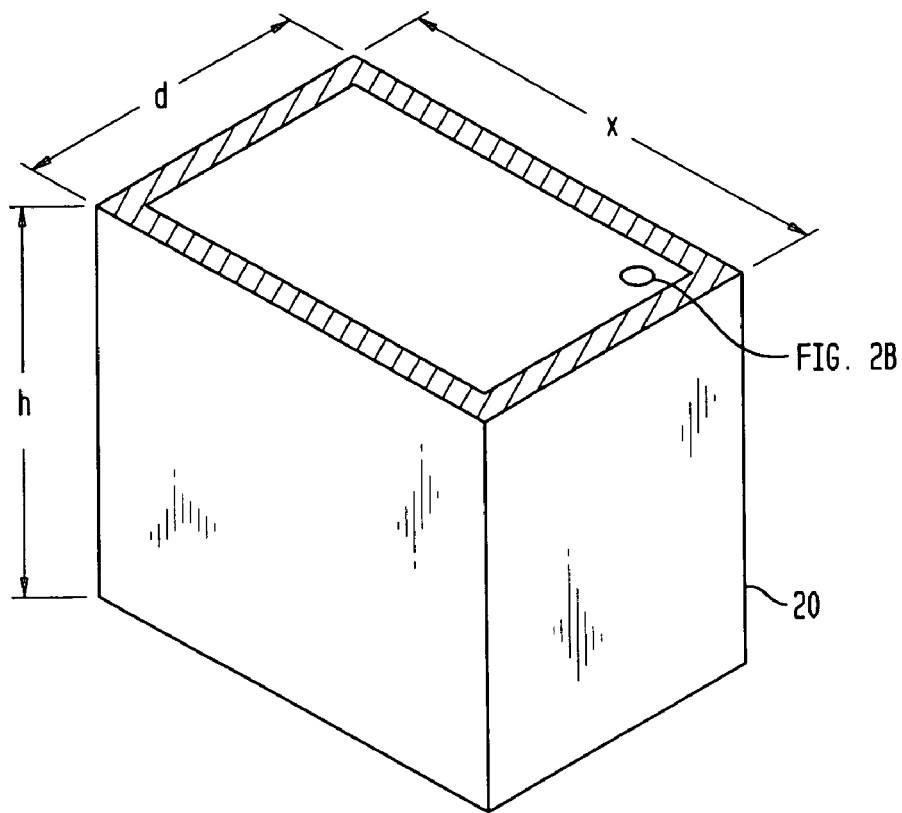
FIG. 2a is a diagrammatic perspective view of a mold used in the method of FIG. 1 according to one embodiment of the invention.
Figure 2B:
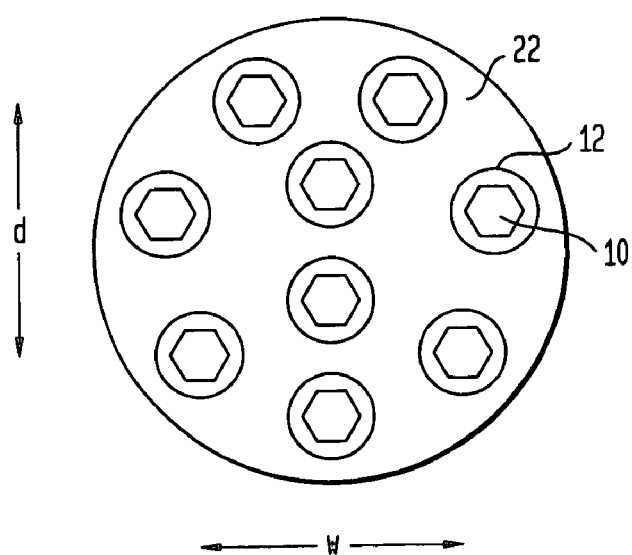
FIG. 2b is an enlarged detailed view of the interior of the mold of FIG. 2a according to one embodiment of the present invention.

As shown in FIG. 2, a plurality ferromagnetic rods 10 and sleeves 12 are assembled, and placed side-by-side in a mold 20 of height h, width x and depth d. For example, one process uses a mold 20 of a rectangular shape with dimensions 152.4 mm deep, 553.7 mm wide and 723.9 mm high. The axes of the rods 10 are aligned with the height dimension h. The mold is preferably made of aluminum, however any suitable metal will suffice. About 540 rods 10 are preferably placed side-by-side in the mold 20. At this stage of the process, the sleeves 12 keep the ferromagnetic rods 10 apart.

Once the rods 10 and sleeves 12 are placed in mold 20, a bonding material 22 is introduced. It is preferred that the bonding material 22 be dielectric and be in a liquid state. As an example, one process uses an epoxy, such as a standard 4 part resin/hardener mixture, as a dielectric bonding material 22. To ensure that the dielectric bonding material 22 completely covers each ferromagnetic rod 10 and to prevent the formation of voids, the mold 20 is sealed on the bottom and all four sides and filled with epoxy while loading the ferromagnetic rods 10. The porous sleeves 12 allow the bonding material to penetrate through the sleeves and adhere to the rough surfaces of the rods 10. It should be noted, however, that the dielectric material need not be in a liquid state, nor be bonding. For example, the dielectric material may be a discrete, non-conductive material, so long as the ferromagnetic rod 10 are held apart while in the mold 20.

Figure 3A:
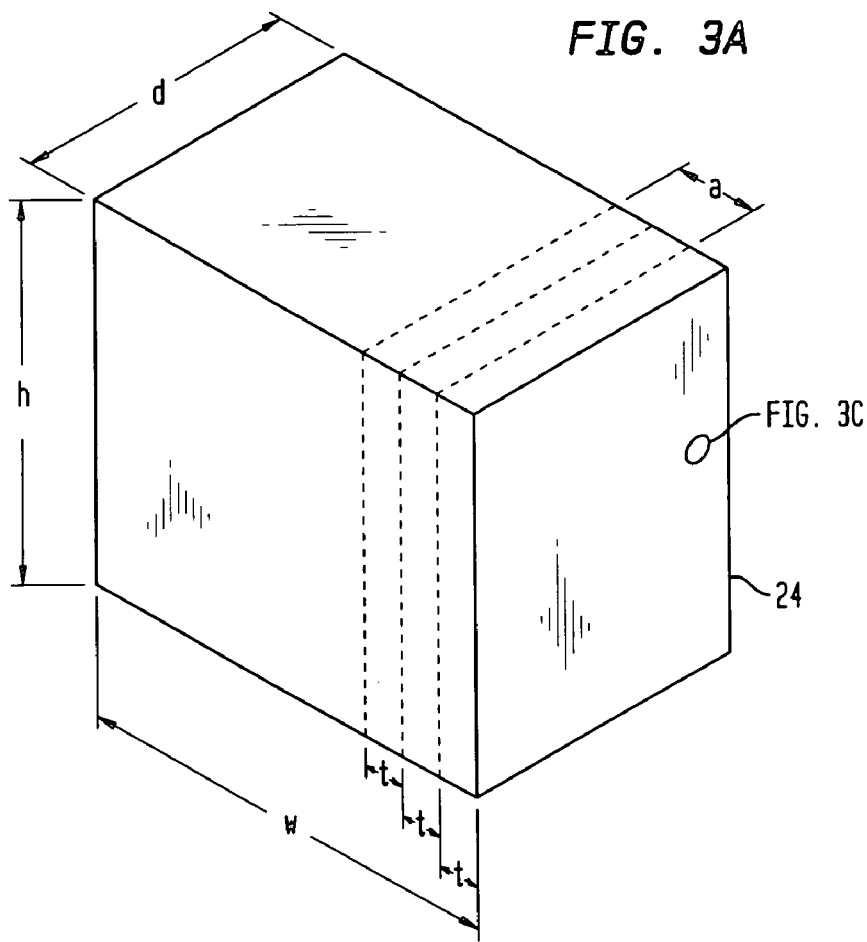
FIG. 3a is a diagrammatic perspective view of an intermediate element resulting from the method of FIGS. 1–2.
Figure 3B:
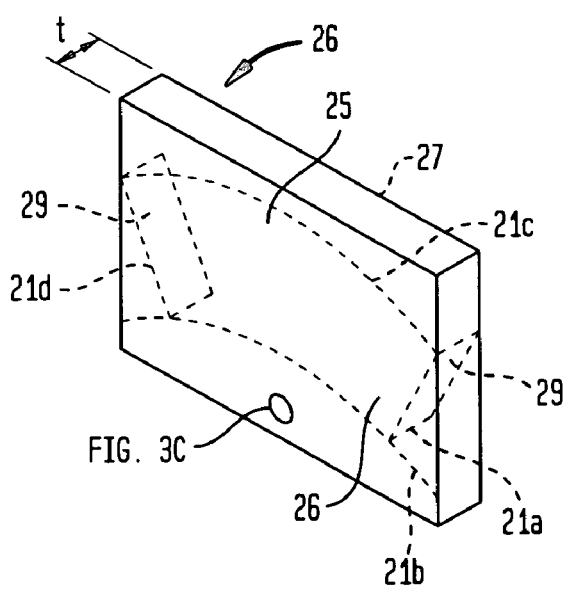
FIG. 3b is a diagrammatic perspective view of a shim piece formed from the intermediate element shown in FIG. 3a, according to one embodiment of the present invention.
Figure 3C:
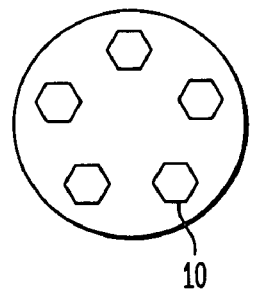
FIG. 3c is an enlarged detailed view of a portion of the intermediate element of FIG. 3a and the shim piece of FIG. 3b according to one embodiment of the present invention.

When the mold 20 is free of voids, the dielectric bonding material 22 is allowed to cure by ramp up from ambient temperature to 277° and holding at 277° F. for 10 hrs. before turning off to let cool to room temperature. Once the dielectric bonding material 22 has cured, an intermediate element 24 is formed, as shown in FIG. 3. The intermediate element 24 is removed from the mold 20 by removing the cover and backing off the pressure plates of the mold. The intermediate element has a lengthwise direction corresponding to the axial direction of rods 10.

The intermediate element 24 is then sliced on cutting planes α transverse to the axial direction of the ferromagnetic rods 10, to form a shim piece 26. The slicing step is preferably performed using a cut-off saw such as a Do-All metal cutting band saw model C-9165, but other saws can also be used.

Each shim piece 26 is a generally flat slice having a thickness direction t corresponding to the axial direction of the rods 10 and having a top face 25 and bottom face 27 transverse to the thickness dimension. The other dimensions of the shim piece 26 correspond to the dimensions of the mold 20. Preferably, all shim pieces 26 are equal in thickness. Each shim piece 26 is then trimmed to give it a generally arcuate shape when viewed along the axial direction of the rods 10. The trim lines 21a–d are also shown on FIG. 3. Further, the ends of the shim piece 26 are trimmed along lines 21c and 21d extending generally radially with respect to the arc. This provides radially-extensive edges 29 at the ends of the arcuate shim pieces and allows the shim pieces to be mounted together to form a circular shim on the magnet. The trimming step is preferably done with an abrasive jet saw, but other types of saws can be used. The thickness of each shim piece can be adjusted, and the top face 25 and bottom face 27 can be "trued-up" to make more precise flatness and parallelism by milling and/or grinding these surfaces.

Figure 4:
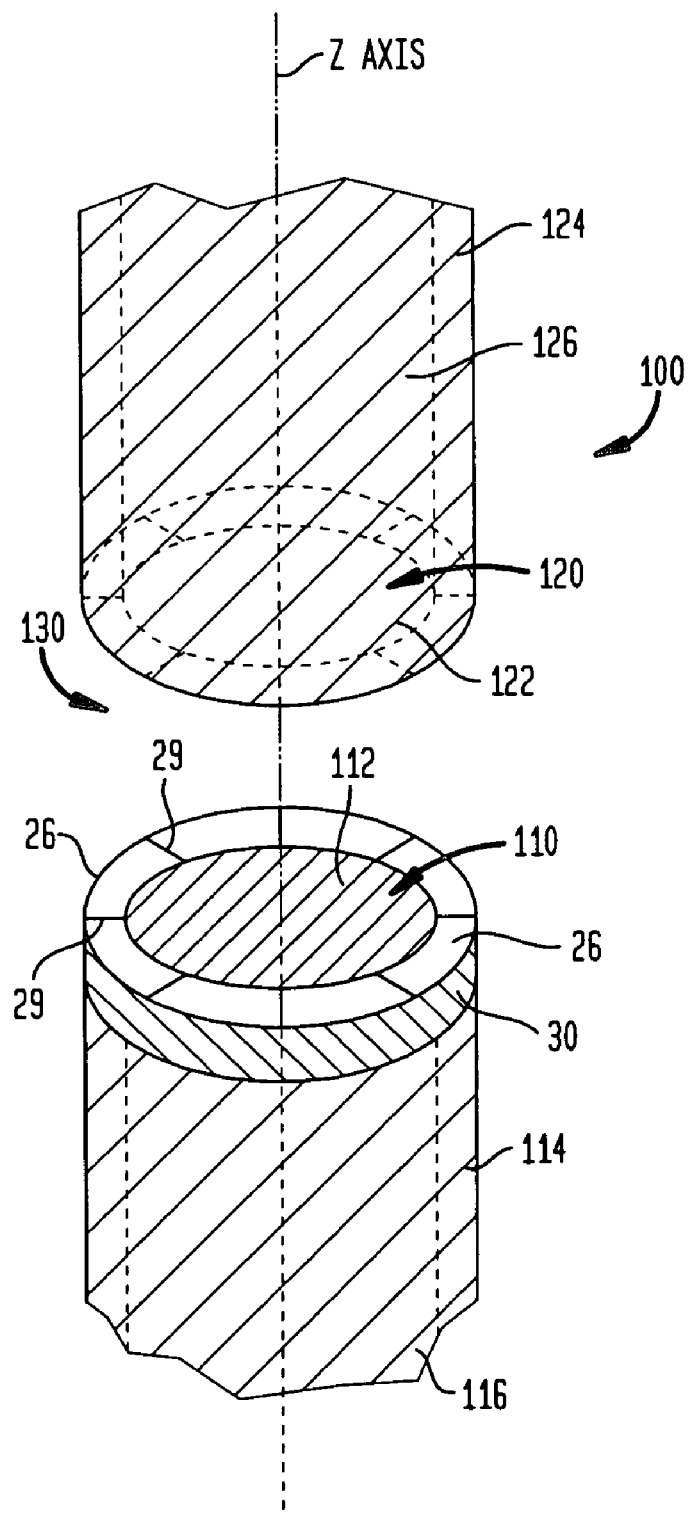
FIG. 4 is a diagrammatic perspective view of a magnet assembly incorporating the shim pieces of FIGS. 1–3.
Figure 5:
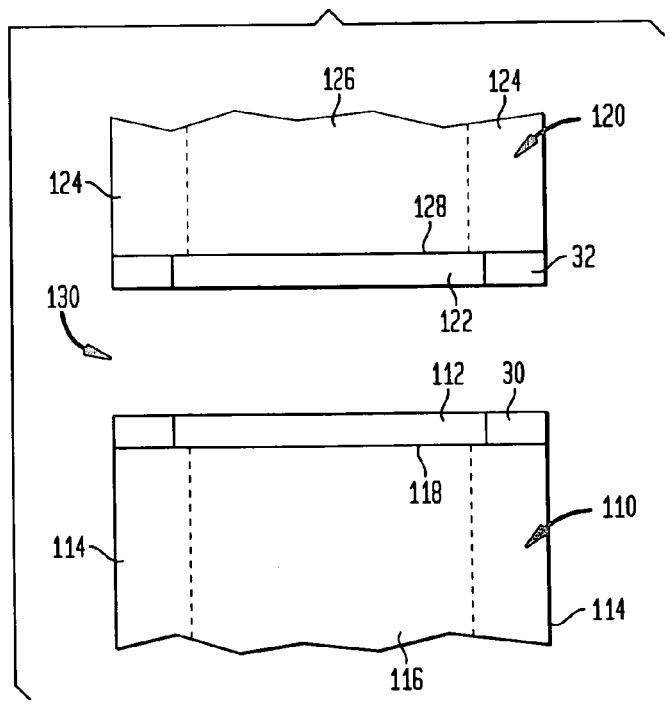
FIG. 5 is a fragmentary sectional view of the assembly shown in FIG. 4.

Now referring to FIG. 4, a magnetic assembly 100 is shown. The magnetic assembly comprises a ferromagnetic structure defining a first pole 110 and another ferromagnetic structure defining a second pole 120. The poles facings have a generally circular profile when viewed along the poles' axis z and are opposed to each other such that a patient receiving space 130 is defined between the pole facings, as shown in FIG. 5. Gradient coils 112 and 122 are also provided which create the gradient magnetic field used in the MRI process to generate an image of the subject in the patient receiving space 130. As shown in FIGS. 4 and 5, the gradient coils are placed between the shim ring 30 and atop the pole face 118 and 128. Static field coils 114 and 124 or other flux sources associated with the poles are provided to generate the static magnetic field used in the MRI process. These features of the assembly may be conventional. As shown in FIGS. 4 and 5, the static field coils are in the shape of large rings that extend around the pole stems 116 and 126.

As shown in FIG. 4, however, a first pole 112 is provided with a shim ring 30 incorporating eight arcuate shim pieces 26. The arcuate shim pieces are arranged in generally end-to-end relation, the radially-extensive end-edges 29 of the shim pieces fitting against one another. Alternatively, the shim pieces 26 can form a shim ring with gaps between the shim pieces. This arrangement prevents eddy currents from travelling from one shim piece to another. A similar shim ring 32 can be formed by additional shim pieces 26 on the pole 120. The axes of the ferromagnetic rods 10 contained in the shim pieces 26 are co-directional with the polar axis. Preferably, the pole facings 118 and 128 will have holes drilled around the circumference where the shim pieces 26 are to be placed. Preferably, bolts or other fasteners are used to attach the shim pieces 26 to the pole facings 118 and 128. Preferably, the shim pieces 26 are approximately 1 inch thick and are stacked, one directly on top of the other. In FIG. 5, the shim rings 30 and 32 shown are three stacked 1 inch thick shim pieces.

As further shown in FIGS. 4 and 5, the gradient coils 112 and 122 are positioned in close proximity to the pole facings 118 and 128. This proximity adds to the problem of creating eddy currents in the shim. When the gradient magnetic coils are operated, this will induce eddy currents in the ferromagnetic structure defining the pole facings 118 and 128, and particularly in the shim rings 30 and 32. However, the currents can only travel in the thickness direction of the shim rings along the length of the ferromagnetic rods 10 or in small circular patterns along the cross-section of the ferromagnetic rods 10. Currents cannot pass in other directions from rod-to-rod due to the dielectric material between the rods. This greatly minimizes eddy current generation. Of course, still better performance can be achieved if the pole faces are also eddy-resistant.

Figure 6:
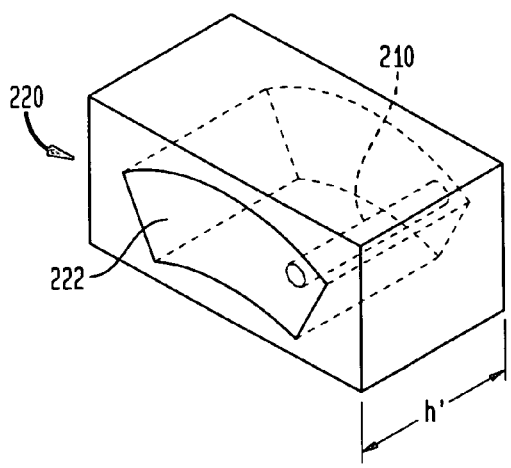
FIG. 6 is a diagrammatic perspective view of a mold used in a process according to another embodiment of the invention.

In a process according to a further embodiment, the mold 220 (FIG. 6) has a cavity 222 of substantially arcuate cross-sectional shape. The arcuate shape is constant in the lengthwise direction h' of the mold. Here again, the rods 210 extend lengthwise in the mold. This yields an arcuate intermediate element which can be sliced to form arcuate shim pieces thereby reducing or eliminating the need for trimming. In other respects, the process is as described above.

Figure 7:
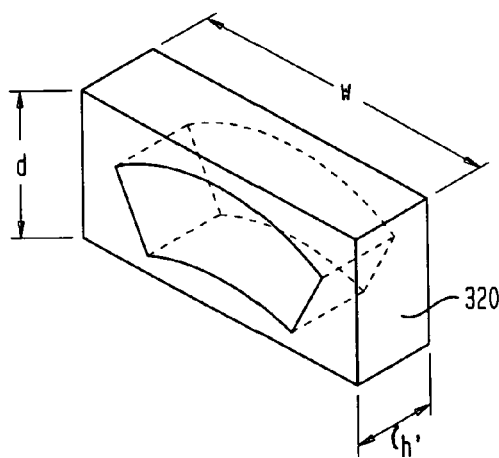
FIG. 7 is a diagrammatic perspective view of a mold used in a process according to another embodiment of the invention.

In a process according to another embodiment, the mold 320 has a height h' corresponding to the thickness of the final shim piece, as best shown in FIG. 7. By having the mold in the form of the final shim piece, the need for the slicing step is obviated. The intermediate element resulting from this mold is substantially in the shape of the shim piece, but will still require trimming to "true up" the shape to ensure proper fitting around the magnet pole.

This detailed description is only illustrative and should not be read as limiting the invention as defined in the claims.

What is claimed is:

1. A method of making pieces for a magnetic resonance imaging magnet comprising the steps of:
   (a) providing an intermediate element including a plurality of solid elongated ferromagnetic rods extending side-by-side in a lengthwise direction with a dielectric material therebetween; and (b) slicing said intermediate element transverse to said lengthwise direction to form a plurality of magnetic resonance shim pieces each having a thickness direction corresponding to the lengthwise direction of said rods in said intermediate element.

2. A method as claimed in claim 1 further comprising the step of assembling a plurality of said shim pieces with a magnet pole to form a shim on said pole.

3. A method as claimed in claim 2 wherein said assembling step is performed so as to form a shim in the form of a substantially closed shim ring.

4. A method as claimed in claim 3 wherein said shim pieces are assembled with gaps between said shim pieces forming said substantially closed shim ring.

5. A method as claimed in claim 2 wherein said intermediate element has a generally arcuate shape in a section transverse to said longitudinal direction of said rods, whereby said shim pieces are generally arcuate.

6. A method as claimed in claim 2 wherein said shim pieces all have substantially equal thickness.

7. A method as claimed in claim 1 wherein said step of slicing said intermediate element includes cutting through the intermediate element with a saw.

8. A method as claimed in claim 1 further comprising a step of trimming said shim pieces to alter the profiles of said shim pieces in a plane transverse to the thickness of said shim pieces after said slicing step forming a general arcuate form.

9. A method as claimed in claim 8 wherein said trimming step includes cutting through the shim pieces with an abrasive jet.

10. A method as claimed in claim 8 wherein said trimming step includes using a milling machine.

11. A method as claimed in claim 1 wherein said step of providing said intermediate element includes cleaning said rods of any oily residue or other contaminants.

12. A method as claimed in claim 1 wherein said step of providing said intermediate element including roughening said rods and removing oxides, dirt or any other contaminants from surfaces of said rods.

13. A method as claimed in claim 1 wherein said step of providing said intermediate element includes covering said rod with a dielectric sleeve.

14. A method as claimed in claim 1 wherein said step of providing said intermediate element includes placing said rods in a mold and curing said dielectric material around said rods in said mold.

15. A method as claimed in claim 14 wherein said dielectric material includes an epoxy.

16. A method as claimed in claim 14 wherein said dielectric material is placed between a dielectric sleeve and said rod.

17. A method as claimed in claim 14 wherein a dielectric sleeve is a fiberglass sleeve.

18. A method as claimed in claim 1 wherein said rods are substantially hexagonal in cross-sectional shape.

19. A method of making shim pieces for a magnetic resonance imaging magnet comprising:
providing an intermediate element including a plurality of elongated ferromagnetic rods extending side-by-side in a lengthwise direction with a dielectric material therebetween;
slicing the intermediate element transverse to the lengthwise direction to form a plurality of shim pieces each having a thickness direction corresponding to the lengthwise direction of the ferromagnetic rods in the intermediate element; and
assembling a plurality of the shim pieces on a pole of the magnetic resonance imaging magnet to form a shim on the pole.

20. A method as claimed in claim 19 wherein said assembling step is performed so as to form a shim in the form of a substantially closed shim ring.

21. A method as claimed in claim 20 wherein the shim pieces are assembled with gaps between the shim pieces forming the substantially closed shim ring.

22. A method as claimed in claim 19 wherein the intermediate element has a generally arcuate shape in a section transverse to the longitudinal direction of the rods and whereby the shim pieces are generally arcuate.

23. A method as claimed in claim 19 further comprising a step of trimming the shim pieces to alter the profiles of the shim pieces in a plane transverse to the thickness of the shim pieces after the slicing step forms a general arcuate shape.

24. A method as claimed in claim 23 wherein said trimming step includes cutting through the shim pieces with an abrasive jet.

25. A method as claimed in claim 23 wherein said trimming step includes using a milling machine.

26. A method as claimed in claim 19 wherein said step of providing said intermediate element includes covering said rod with a dielectric sleeve.

27. A method as claimed in claim 19 wherein said step of providing said intermediate element includes placing the ferromagnetic rods in a mold and curing the dielectric material around the ferromagnetic rods in the mold.

28. A method as claimed in claim 27 wherein the dielectric is placed between a dielectric sleeve and the rod.

29. A method as claimed in claim 27 wherein the dielectric sleeve is a fiberglass sleeve.

30. A method as claimed in claim 19 wherein said rods are substantially hexagonal in cross-sectional shape.

* * * * *

UNITED STATES PATENT AND TRADEMARK OFFICE
CERTIFICATE OF CORRECTION

PATENT NO. : 6,973,711 B1
APPLICATION NO. : 09/577476
DATED : December 13, 2005
INVENTOR(S) : Raymond V. Damadian It is certified that error appears in the above-identified patent and that said Letters Patent is hereby corrected as shown below:

Column 3, line 14 after "with" delete --,--.
Column 3, line 50 after "invention" add --.--.
Column 4, line 60 after "plurality" add --of--.
Column 4, line 66 after "however" add --.--.
Column 5, line 19 add --s-- to the word --rod--.
Column 5, line 59 the word "poles" change to --poles'--.
Column 7, line 38 change "including" to --includes--.
Column 8, line 46 after "tric" add the word --material--.

Signed and Sealed this

Twenty-third Day of October, 2007

JON W. DUDAS
*Director of the United States Patent and Trademark Office*